(12) United States Patent
Nogawa et al.

(10) Patent No.: US 6,665,046 B2
(45) Date of Patent: Dec. 16, 2003

(54) EXPOSURE APPARATUS AND DEVICE MANUFACTURING METHOD

(75) Inventors: Hideki Nogawa, Utsunomiya (JP); Hitoshi Nakano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 57 days.

(21) Appl. No.: 09/879,912

(22) Filed: Jun. 14, 2001

(65) Prior Publication Data

US 2002/0018190 A1 Feb. 14, 2002

(30) Foreign Application Priority Data

Jun. 15, 2000 (JP) .......................... 2000-179590

(51) Int. Cl.[7] .......................... G03B 27/52; G03B 27/62
(52) U.S. Cl. ........................................... 355/30; 355/75
(58) Field of Search .............................. 355/30, 75, 76, 355/72, 53

(56) References Cited

U.S. PATENT DOCUMENTS

| | | | |
|---|---|---|---|
| 4,305,656 A | * 12/1981 | Smith | ......................... 355/132 |
| 4,819,033 A | * 4/1989 | Yoshitake et al. | ............. 355/53 |
| 5,499,076 A | * 3/1996 | Muraki | ......................... 355/53 |
| 5,559,584 A | 9/1996 | Miyaji et al. | .................. 355/73 |
| 5,877,843 A | * 3/1999 | Takagi et al. | .................. 355/30 |
| 5,955,243 A | * 9/1999 | Tanitsu | ........................ 430/311 |
| 5,997,963 A | * 12/1999 | Davison et al. | ............. 118/722 |

FOREIGN PATENT DOCUMENTS

| | | | |
|---|---|---|---|
| JP | 6-260385 | 9/1994 | ......... H01L/21/027 |
| JP | 8-279458 | 10/1996 | ......... H01L/21/027 |

OTHER PUBLICATIONS

Hideo Okabe, "Photochemistry of Small Molecules", *Wiley–Interscience Publication*, 1978, p. 224–226.

* cited by examiner

*Primary Examiner*—Russell Adams
*Assistant Examiner*—D. Ben Esplin
(74) *Attorney, Agent, or Firm*—Fitzpatrick, Cella, Harper & Scinto

(57) ABSTRACT

A scan type exposure apparatus for transferring an image of a pattern formed on a mask onto a substrate by synchronously scanning the mask and the substrate in a scanning direction. The apparatus includes a movable stage for holding a substrate thereon, an optical system through which an exposure light path extends, a cover member for encircling the exposure light path, from an end of the optical system toward the stage, and a gas supplying port for discharging an inactive gas into the cover member, wherein the gas is supplied at a predetermined angle with respect to the scan direction.

49 Claims, 13 Drawing Sheets

| URL | http://www.maintain.co.jp./db/input.html |

TROUBLE DB INPUT WINDOW

| DATE | 2000/3/15 | ~404 |
| MACHINE | ********* | ~401 |
| FILE | OPE. FAILURE (STARTING ERROR) | ~403 |
| S.N. S/N | 465NS4580001 | ~402 |
| EMERGENCY | D | ~405 |

STATE: LED FLICKERING AFTER POWERED ~406

SOLUTION: RESTART:PRESS RED BUTTON ~407

PROGRESS: TEMPORARY SOLUTION DONE ~408

[NEXT] [RESET]

~410 LINK TO RESULT LIST. DATABASE

~411 SOFTWARE LIBRARY

~412 OPERATION GUIDE

FIG. 13

EXPOSURE APPARATUS AND DEVICE MANUFACTURING METHOD

FIELD OF THE INVENTION AND RELATED ART

This invention relates generally to an exposure apparatus for projecting pattern of a mask onto a photosensitive substrate through a projection optical system. More particularly, the invention concerns an exposure apparatus of the type that uses ultraviolet light as exposure light.

Conventionally, the procedure of manufacturing semiconductor devices comprising very fine patterns such as LSI or VLSI uses a reduction type projection exposure apparatus which functions to project and photoprint, in a reduced scale, a circuit pattern formed on a mask onto a substrate being coated with a photosensitive material. Increases in the density of the semiconductor device have forced further miniaturization, and advancement in the resist process as well as improvement of the exposure apparatus to meet the miniaturization have been pursued.

The resolving power of an exposure apparatus can be improved by, for example, shortening the exposure wavelength used or by enlarging the numerical aperture (NA) of a projection optical system.

As regards the exposure wavelength, recently, in place of i-line (365 nm), KrF excimer lasers having an emission wavelength of about 248 nm or ArF excimer lasers having an emission wavelength of about 193 nm have been developed. Further, fluorine ($F_2$) lasers having an emission wavelength of about 157 nm are being developed.

In regards to deep ultraviolet light, particularly, ArF excimer lasers having a wavelength of about 193 nm or $F_2$ excimer lasers having an emission wavelength of about 157 nm, it is known that there is an oxygen ($O_2$) absorption band in the regions about these wavelengths.

For example, because of its short wavelength (157 nm), the applicability of fluorine excimer lasers to exposure apparatuses have been attempted. However, the wavelength of 157 nm is present in a range of a wavelength region generally called a vacuum ultraviolet region. In such a wavelength region, the absorption of light by oxygen molecules is large. As a result, the atmosphere does not transmit most of the light. Therefore, this light source can be used only in a situation that the atmospheric pressure is reduced close to vacuum and that the oxygen concentration is sufficiently lowered. According to "Photochemistry of Small Molecules", Hideo Okabe, A Wiley-Interscience Publication, 197, pp. 224–226, the absorption coefficient of oxygen to light of a wavelength of 157 nm is about 190 $atm^{-1}cm^{-1}$. This means that, when light having a wavelength of 157 nm passes through a gas having an oxygen concentration of 1%, under a unit atmospheric pressure, the transmission factor T per 1 cm is only:

$T=\exp(-190 \times 1cm \times 0.01atm)=0.150.$

Further, as the oxygen absorbs the light, ozone ($O_3$) is produced. The ozone accelerates the absorption of light, and the transmission factor is degraded considerably. Additionally, various products are created by the ozone, and they are deposited on the surfaces of optical elements to decrease the efficiency of the optical system.

In consideration of them, in projection exposure apparatuses which use deep ultraviolet rays such as an ArF excimer laser or an $F_2$ excimer laser, purging means such as inactive gas (e.g., nitrogen) is provided at the light path of an exposure optical system, to suppress the oxygen concentration at the light path to a low level on an order of a few ppm or less.

As described above, in exposure apparatuses using deep ultraviolet light, particularly, an ArF excimer laser having a wavelength of about 193 nm or a fluorine ($F_2$) excimer laser having a wavelength of about 157 nm, because the ArF excimer laser light or $F_2$ excimer laser light is very easily absorbed by a substance, the light path must be purged to a level on an order of a few ppm or less. Further, this is also the case with the moisture. It should be reduced to a level of a ppm order.

In order to assure the transmission factor to ultraviolet light or the stability of it, the light path of the ultraviolet light in relation to a reticle stage, for example, of an exposure apparatus may be purged. As an example, Japanese Laid-Open Patent Application, Laid-Open No. 260385/1994 shows blowing an inactive gas against a photosensitive substrate. However, this is insufficient in regard to the purge of oxygen and moisture. Japanese Laid-Open Patent Application, Laid-Open No. 279458/1996 shows use of a sealingly covering member for covering the whole space, adjacent to a photosensitive substrate, below a bottom end of a projection optical system. This structure is, however, impractical because the stage motion is made difficult.

As described above, in exposure apparatuses using ultraviolet light, particularly, ArF excimer laser light or $F_2$ excimer laser light, because of a large absorption of the ArF excimer laser light or $F_2$ excimer laser light by oxygen or the water content, it is necessary to lower the oxygen concentration and water concentration so as to obtain a sufficient transmission factor and a stability of the ultraviolet light.

It is, therefore, desired to develop purging means effective to an ultraviolet light path in an exposure apparatus, particularly, in portions adjacent to a wafer and a reticle where insertion and retraction of a component are made frequently.

SUMMARY OF THE INVENTION

It is an object of the present invention to provide purging means suitably usable in an exposure apparatus for projecting a pattern of a mask onto a photosensitive substrate, which is effective to locally purge an exposure light path of the exposure apparatus by use of an inactive gas.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 13 is a schematic view for explaining an example of a user interface.

DESCRIPTION OF THE PREFERRED EMBODIMENTS

Preferred embodiments of the present invention will now be described with reference to the accompanying drawings.

The present invention is not limited to any particular exposure apparatus. The present invention is applicable to any exposure apparatus for projecting a pattern of a mask onto a photosensitive substrate through a projection optical system, particularly, those which use ultraviolet light as exposure light.

The ultraviolet light to be used as exposure light in exposure apparatuses according to the present invention is not limited to a particular one. However, the present invention is particularly effective to deep ultraviolet light, specifically, an ArF excimer laser having a wavelength of about 193 nm or an $F_2$ excimer laser having a wavelength of about 157 nm.

Embodiment 1

Figure 1:
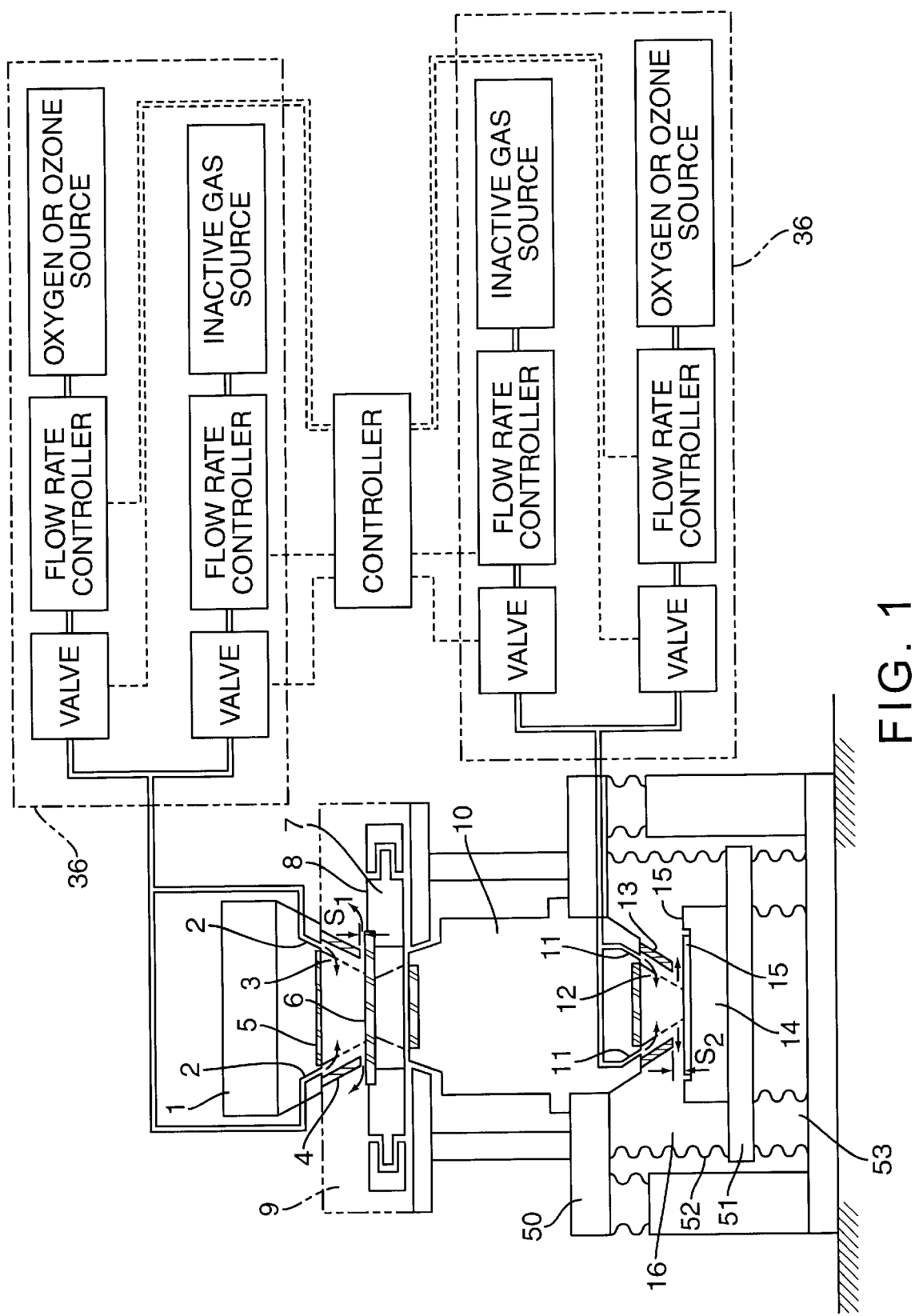
FIG. 1 is a schematic view of a general structure of a projection exposure apparatus according to an embodiment of the present invention.

FIG. 1 shows a main portion of a step-and-scan type projection exposure apparatus according to an embodiment of the present invention. In FIG. 1, ultraviolet light, which is emitted from an ultraviolet light source (not shown) and which enters an illumination optical unit 1 inside the exposure apparatus, illuminates a reticle 6 placed on a reticle stage 7. There is a cover 4 for encircling the path of the ultraviolet light, extending from the reticle side bottom end of the illumination optical unit 1 to the reticle stage 7. There are nozzles 2 inside the cover 4, which function as gas supply ports for blowing a purge gas (inactive gas) into the interior of the cover 4. There is a gap s1 defined between the free end of the cover 4 and the reticle 6. An inactive gas such as nitrogen, helium or argon, is blown into the cover 4, from the inside of the illumination optical unit 1 and through the nozzles 2, thereby to purge unwanted substances such as oxygen and moisture, for example, inside the cover 4. The reticle stage 7 is provided with a top plate 8 which is made coplanar with the upper face of the reticle 6. Thus, when the reticle stage 7 moves for the scan motion, it does not get out of the region being effectively purged by the cover 4. Although impurities inside the cover 4 can be sufficiently removed with this structure, there may be additional purging means (not shown) for purging the outside of the cover 4. Since impurities outside the cover can be removed on that occasion, to a certain extent, this is effective to further decrease the impurity concentration inside the cover 4. Here, the purge area 9 outside the cover 4 may be one as depicted by a broken line in the drawing.

The ultraviolet light passing through the reticle 6 goes through a projection optical unit 10, and it illuminates a wafer 15 placed on a wafer stage 14. There is a cover 13 for encircling the path of ultraviolet light, extending from the wafer side bottom end of the projection optical unit 10 to the wafer stage 14. There are nozzles 11 which function as gas supply ports for blowing a purge gas (inactive gas) into the cover 13. An inactive gas such as nitrogen, helium or argon, is blown into the cover 13, from the inside of the projection optical unit 10 and through the nozzles 11, thereby to purge unwanted substances such as oxygen and moisture, for example, inside the cover 13. There is a gap s2 defined between the free end of the nozzle 11 and the wafer 15. The wafer stage 14 is provided with a top plate 15 which is made coplanar with the upper face of the wafer 15. Thus, when the wafer stage 14 moves for the scan motion, it does not get out of the region being effectively purged by the cover 13. Although impurities inside the cover 13 can be sufficiently removed with this structure, there may be additional purging means (not shown) for purging the outside of the cover 13. Since impurities outside the cover can be removed on that occasion, to a certain extent, this is effective to further decrease the impurity concentration inside the cover 13. Here, the purge area 16 outside the cover 13 may roughly be one as encircled by an optical unit base table 50, a wafer stage base table 51 and a partition wall 52. The partition wall 52 comprises an elastomeric member of a bellows shape, to reduce transmission of vibration or deformation to the projection optical unit base table 50, from the wafer stage base table 51. However, the present invention is not limited to the use of this. In place of it, the partition wall 52 may be a rigid member, not a bellows, and a small clearance may be retained along the whole circumference between the partition wall 52 and the projection optical unit base table 50, without connecting them to each other. On that occasion, the purge gas leaks, and an additional flow rate is required. However, transmission of vibration and deformation can be avoided. As a further alternative, stage dampers 53 may be omitted, and the partition wall 52 may comprise an ordinary rigid member, not a bellows, while the wafer stage base table 51 may be suspended by the partition wall 52 from the projection optical unit base table 50, to provide an integral structure.

In accordance with the exposure apparatus of this embodiment, even when a fluorine gas laser is used as exposure light, impurities along the light path of the fluorine gas laser can be removed, such that a sufficient transmission factor as well as the stability thereof are assured.

Embodiment 2

Figure 2A:
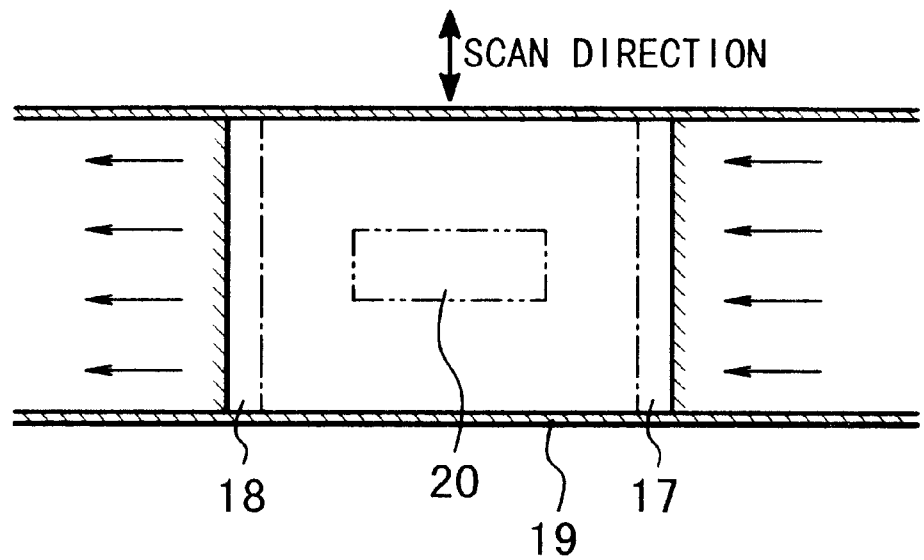
FIGS. 2A and 2B are schematic views, respectively, of a structure about a reticle and a wafer, in a projection exposure apparatus according to another embodiment of the present invention.
Figure 2B:
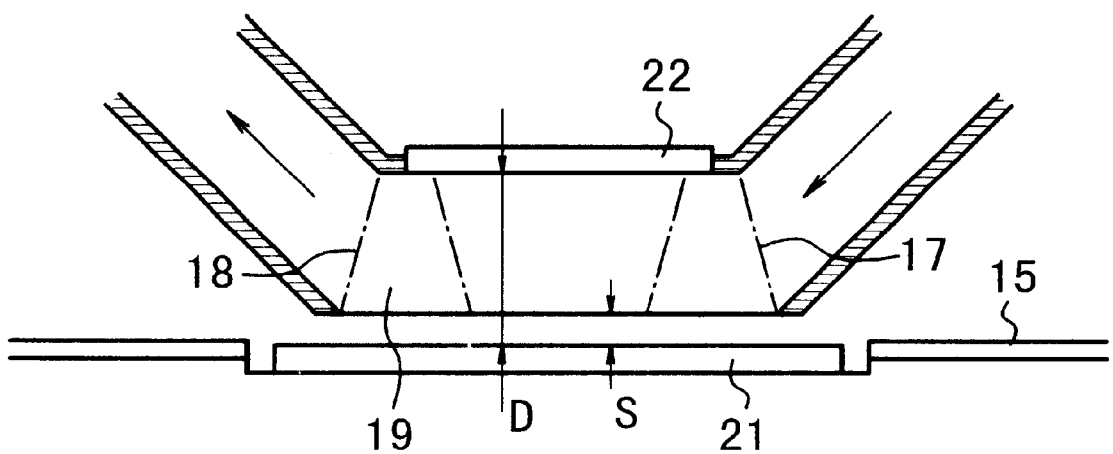

FIGS. 2A and 2B show an embodiment in which a gas supply port for blowing a purge gas inwardly functions also as a cover of this embodiment. Particularly, this is an example wherein a gas supply port for blowing a purge gas inwardly is provided at a side within a cover, while a gas collecting port for drawing the purge gas is provided at another side within the cover, to ensure that the purge gas flows inside the cover.

Specifically, FIGS. 2A and 2B illustrate the flow of a purge gas about a reticle 1 or a wafer 21. FIG. 2A is a plan view, and FIG. 2B is sectional view. In these drawings, a purge gas is blown from a gas supply port 17 toward a reticle or a wafer 21, in a direction of an arrow. Simultaneously, the purge gas is drawn by a gas collecting port 18. Here, the gas supply port 17 and the gas collecting port 18 generally define a cover 19 according to the present invention. Exposure light passes through a sheet glass 22, and it defines an illumination area or projection area 20.

In the point of the purging capacity, the height D from the reticle (or wafer) 21 to the sheet glass 22 may desirably be five times or more the clearance s between the lower end of the cover 19 and the reticle or wafer 21. Further, the reticle stage (or wafer stage) is provided with a top plate which is made coplanar with the reticle or wafer 21 surface. As regards the flow direction of the purge gas, it may be parallel, orthogonal or oblique to the scan direction. Alternatively, it may be changed in response to the scan motion. In the example of FIGS. 2A and 2B, the flow of the purge gas is made orthogonal to the scan direction, to avoid any exposure difference with respect to the scan direction.

In accordance with the exposure apparatus of this embodiment, even when a fluorine gas laser is used as exposure light, impurities along the light path of the fluorine gas laser can be removed, such that a sufficient transmission factor as well as the stability thereof are assured.

Embodiment 3

Figure 3A:
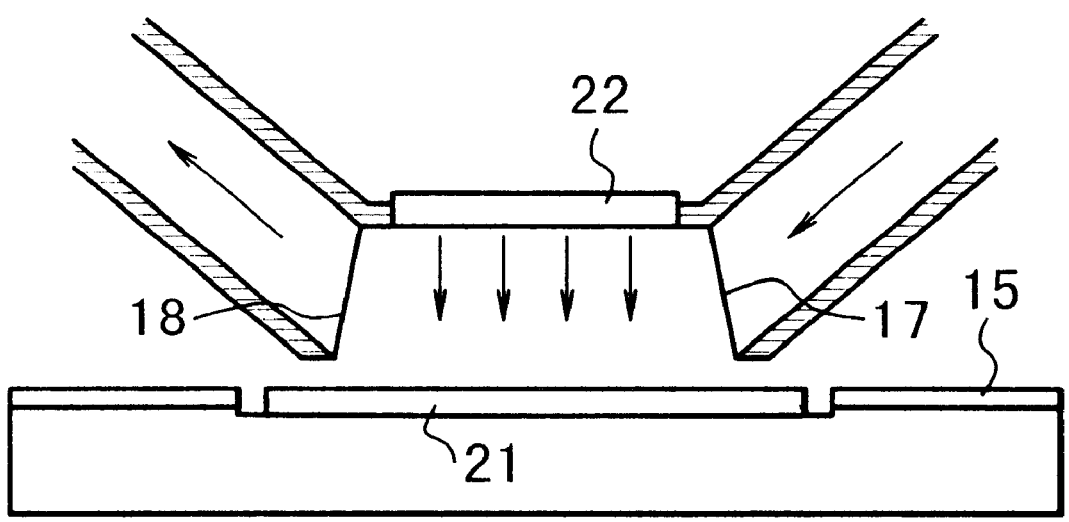
FIGS. 3A and 3B are schematic views, respectively, of a structure about a reticle and a wafer, in a projection exposure apparatus according to a further embodiment of the present invention.
Figure 3B:
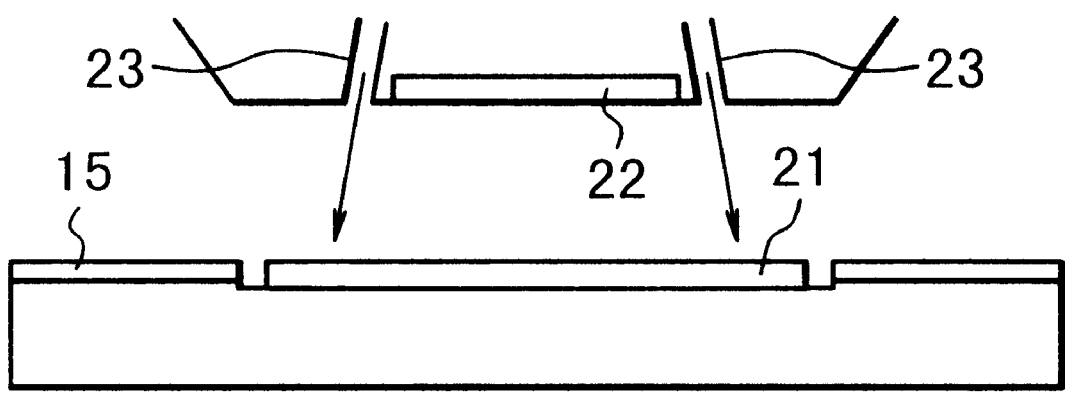

FIGS. 3A and 3B show an embodiment wherein a gas supply port for blowing a purge gas inwardly is provided at a side within a cover, while a gas collecting port for drawing the purge gas is provided at another side within the cover, to ensure that the purge gas flows inside the cover. These ports function also as a portion of the cover of this embodiment. Further, inactive gases are discharged from nozzles provided at both sides to produce an air curtain of purge gas.

FIG. 3A is a sectional view showing a gas supply port and a gas collecting port. FIG. 3B is section view showing air curtains. In this embodiment, purge gases being discharged from air curtain nozzles 23, at both sides, as depicted by arrow, produce air curtains. Inside the air curtains, a purge gas is blown from the gas supply port 17 toward a reticle or wafer 21, in the direction of an arrow. Simultaneously, the purge gas is drawn by the gas collecting port 18. In this manner, the gas supply port 17, the gas collecting port 18 and the air curtain cooperate to generally define a cover of the present invention.

In accordance with the exposure apparatus of this embodiment, even when a fluorine gas laser is used as exposure light, impurities along the light path of the fluorine gas laser can be removed, such that a sufficient transmission factor as well as the stability thereof are assured.

Embodiment 4

Figure 4:
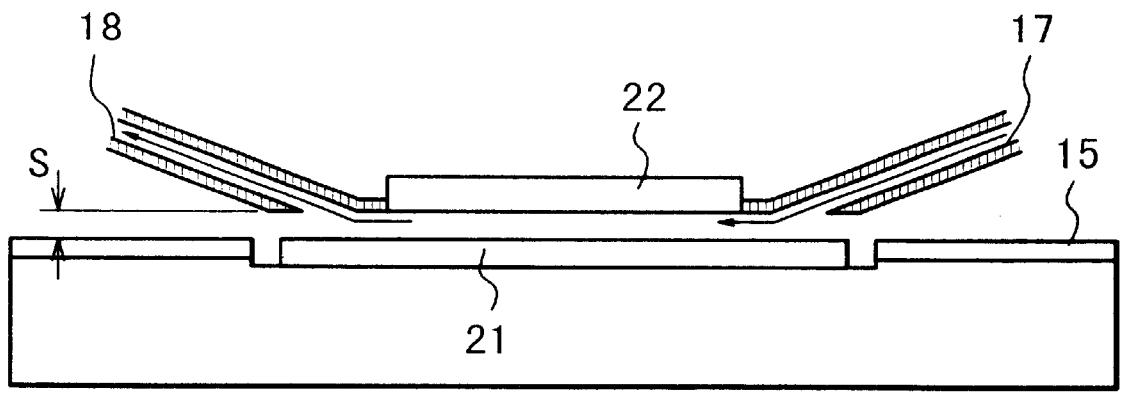
FIG. 4 is a schematic view of a structure about a reticle and a wafer, in a projection exposure apparatus according to another embodiment of the present invention.

FIG. 4 shows another embodiment in which a gas supply port for blowing a purge gas inwardly and a gas collecting port for drawing the purge gas function also as a cover member of the present invention.

In FIG. 4, a gas supply port 17 and a gas collecting port 18 are provided in close proximity to a reticle or wafer 21, with a clearance s.

With the exposure apparatus of this embodiment, the impurity purging effect similar to the second embodiment is attainable.

Embodiment 5

Figure 5:
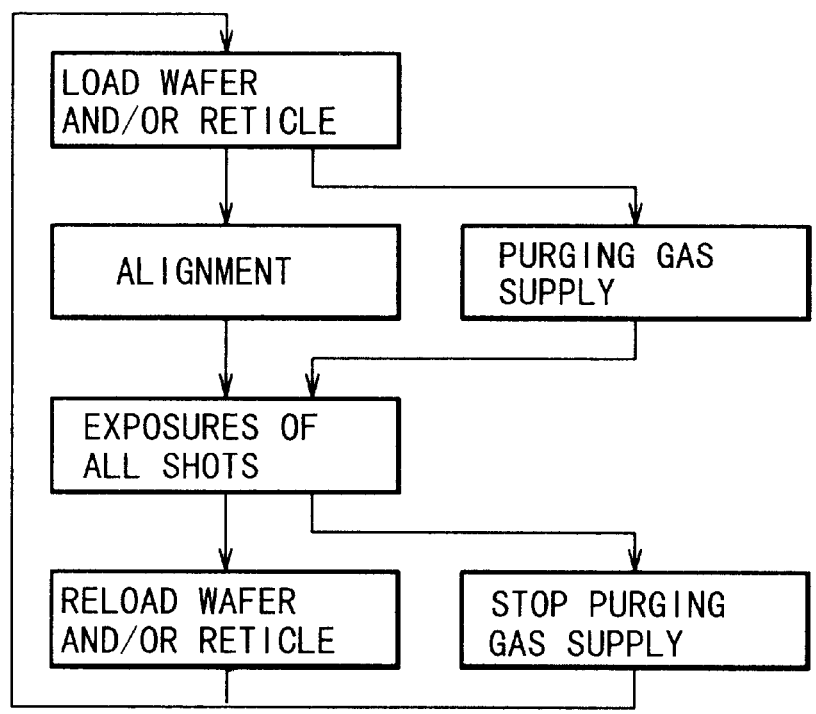
FIG. 5 is a flow chart for explaining a projection exposure operation according to an embodiment of the present invention.

FIG. 5 is a flow chart, showing an embodiment in which the first embodiment described above is changed so that an inactive gas flows only when a wafer and/or a reticle is loaded below the cover, to save the flow rate of the inactive gas. Similarly, while taking into account the presence/absence of the top plate, the inactive gas may flow only when the top plate is loaded.

Embodiment 6

Figure 6:
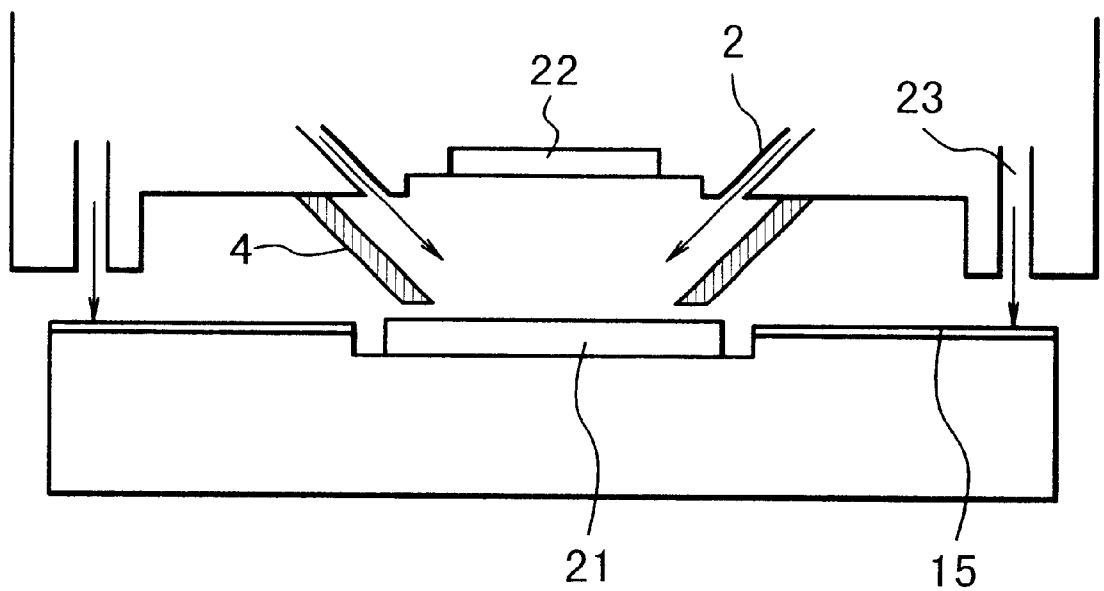
FIG. 6 is a schematic view of a structure about a reticle and a wafer, in a projection exposure apparatus according to a further embodiment of the present invention.

FIG. 6 shows an embodiment in which, in addition to the cover described above, there is an air curtain for discharging a purge gas (inactive gas) along the outside of the cover.

In FIG. 6, an inactive gas discharged from a nozzle 22 defines a purge space, in cooperation with the cover 4. Further, there is an air curtain 23 for discharging a purge gas (inactive gas), outside the cover 4. With this structure, even a space from the cover 4 to the air curtain 23 can be purged by an inactive gas leaked from the inside of the cover 4. Since impurities outside the cover 4 are removed to a certain extent, the impurity concentration inside the cover can be lowered more, such that the impurity purging along the light path of ultraviolet light can be accomplished efficiently.

Embodiment 7

This is an embodiment in which, in the first to sixth embodiments described above, a pressure sensor is provided inside the cover and, additionally, a gas supplying mechanism having a control system for controlling the purge gas pressure is provided. On the basis of the pressure as measured by the pressure sensor, the pressure control of the purge gas is performed so that it is controlled to be constant regardless of the atmospheric pressure.

Advantageous effects peculiar to this embodiment are as follows. The illumination optical unit 1 or the inside of a barrel of the projection optical unit 10 is purged by an inactive gas to remove impurities therein, and a substantially gas-tightly closed system is defined. Therefore, it does not promptly follow a change in outside atmospheric pressure, such that a differential pressure is generated between the barrel inside and the outside. This raises a problem that the sheet glass 22 below the illumination optical unit 1 or the sheet glass 22 below the projection optical unit 10 is deformed due to the differential pressure, and it causes variation in the optical performance in accordance with the pressure change. In this embodiment, however, the purge gas pressure inside the cover is controlled to be constant so that no differential pressure is generated. As a result, a change in optical performance due to a pressure change can be superposed.

Embodiment 8

Figure 7:
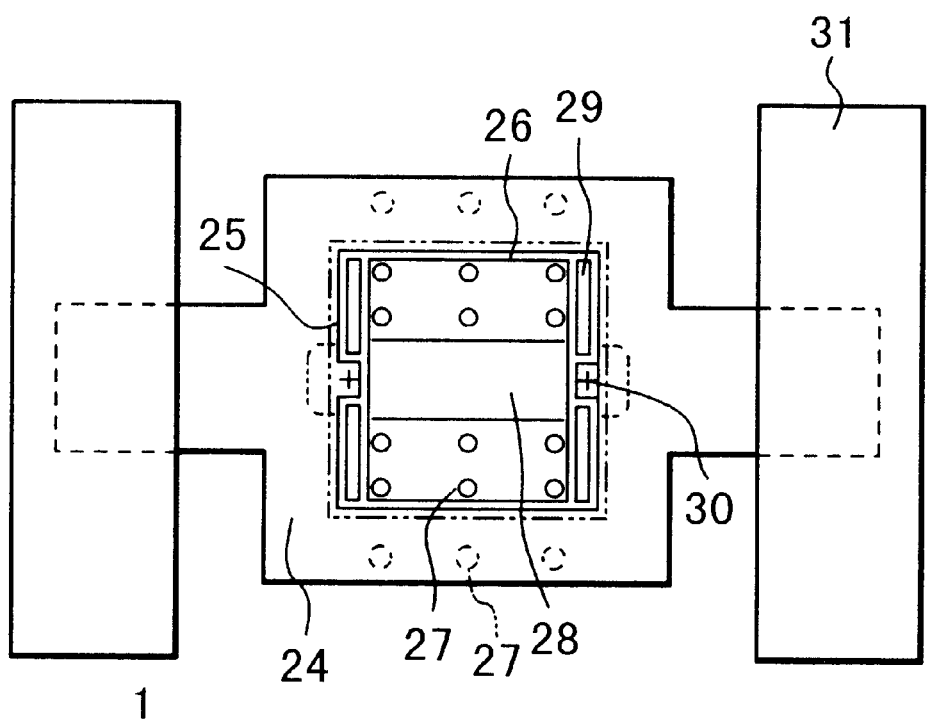
FIG. 7 is a schematic view of a structure about a reticle, in a projection exposure apparatus according to a further embodiment of the present invention.
Figure 8:
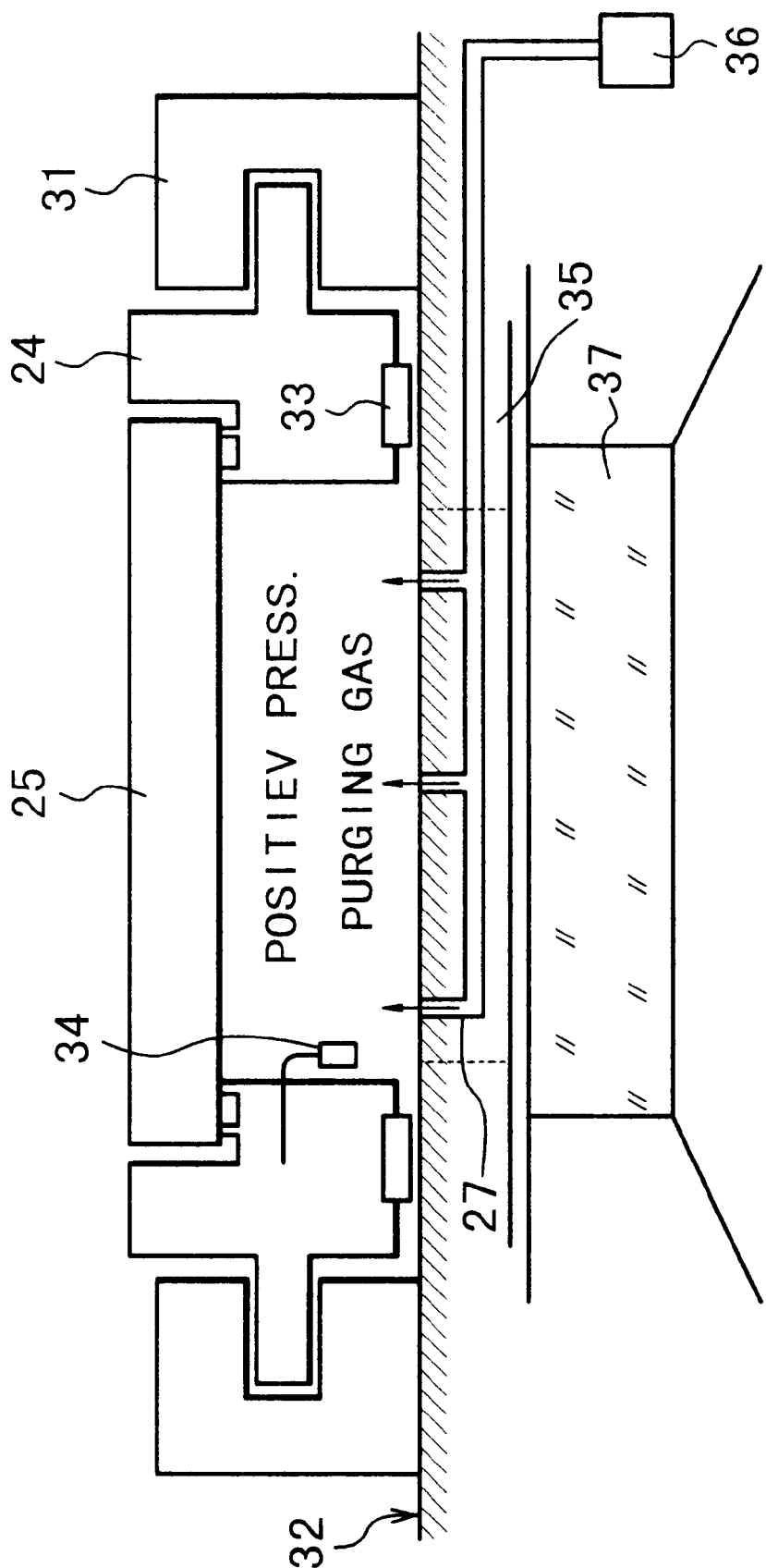
FIG. 8 is a schematic view of a structure about a reticle, in a projection exposure apparatus according to a further embodiment of the present invention.

FIGS. 7 and 8 show an embodiment in which an attraction groove is formed at a reticle surface of a reticle holder of a reticle stage, and in which a base table is provided with a gas supply port for blowing a purge gas (inactive gas) into a space for the reticle holder as defined by the reticle and the reticle holder.

FIG. 7 is a plan view, and FIG. 8 is a sectional view. There are linear motor stators 31 mounted on a reticle running surface 32 on a reticle stage base table 35. A reticle holder 24 is movable while being guided by these linear motor stators 31. The reticle holder 24 has a reticle attracting face 26, and attracting grooves 29 are formed at the periphery thereof. A reticle 25 is placed on the reticle holder with its entire periphery being contacted thereto (although a small clearance may be defined therebetween, by, for example, cutting a portion of the reticle attracting face 26, for example). The inside of the reticle attracting face of the reticle holder 24 is open to define a space there, so as to pass the exposure light. The base table 35 has a base table opening 28 formed at its central portion, and nozzles (gas supply ports) 27 for blowing a purge gas of inactive gas inwardly. With this structure, a purge gas comprising an inactive gas is blown into a reticle holder space as defined by the reticle 25 and the reticle holder 24.

In FIGS. 7 and 8, the nozzles 27 are formed in the base table which is below the reticle 25. However, the projection lens 37 may be disposed opposed to the base table 35 below the reticle 25, while the nozzles may be provided on the base table 35 around the projection lens 37. In place of the nozzles 37 formed on the base table 35, or, alternatively, in addition to these nozzles 27, nozzles corresponding to nozzles 43 of FIG. 9 may be provided on the reticle holder 24, to blow a purge gas.

In accordance with the exposure apparatus of this embodiment, even when a fluorine gas laser is used as exposure light, impurities along the light path of the fluorine gas laser can be removed, such that a sufficient transmission factor as well as the stability thereof are assured.

Embodiment 9

Figure 9:
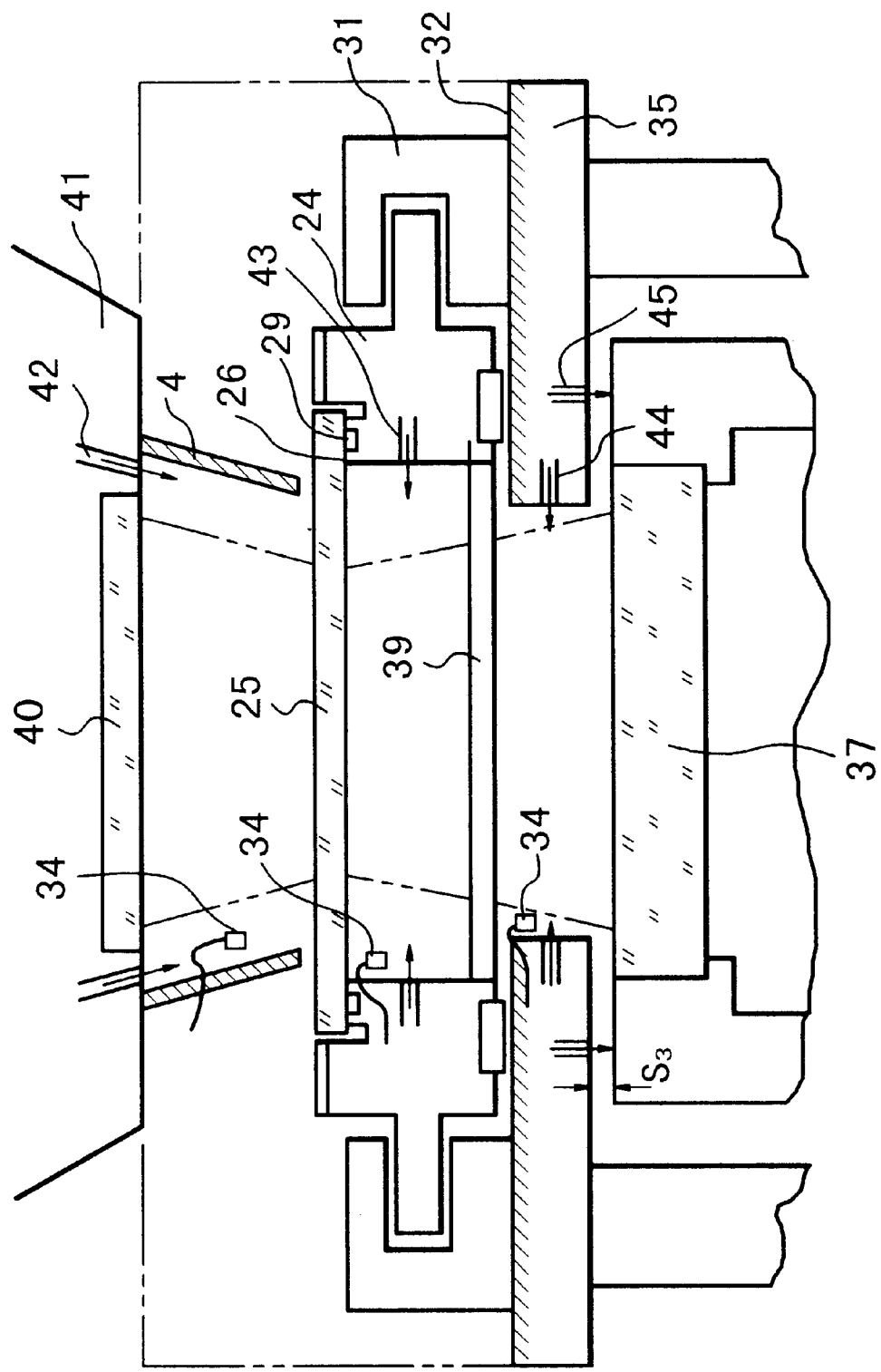
FIG. 9 is a schematic view of a structure about a reticle, in a projection exposure apparatus according to a further embodiment of the present invention.

FIG. 9 shows an embodiment in which an attracting groove is formed on a reticle surface of a reticle holder of a reticle stage, and in which a projection optical unit side of the reticle holder is sealed by a sheet glass. There is a gas supply port for blowing a purge gas, comprising an inactive gas, into a space of the reticle holder as defined by the reticle and the sheet glass.

Like the seventh embodiment described above, also in the embodiment of FIG. 9, linear motor stators 31 are provided at a reticle running surface 32 on a reticle stage base table 35. A reticle holder 24 is moved while being guided by the linear motor stators 31. The reticle holder 24 has a reticle attracting face 26, and attracting grooves 29 are formed at the periphery thereof. A reticle 25 is placed on the reticle holder with its entire periphery being contacted thereto (although a small clearance may be defined therebetween, by, for example, cutting a portion of the reticle attracting face 26, for example). The projection optical unit side of the reticle holder 24 is closed by a sheet glass 39. There are nozzles 43 for blowing a purge gas (inactive gas) into the space of the reticle holder as defined by the reticle 25 and the sheet glass 39. The base table 35 is provided with nozzles 44 for blowing a purge gas (inactive gas) toward the sheet glass 39, and nozzles 45 for blowing a purge gas toward the projection lens 37.

Here, advantageous effects by the provision of the sheet glass are as follows. The space at the opening of the reticle holder 24 is a space which is movable wit the scan motion of the reticle holder 24. On the other hand, the space along the light path from the bottom face of the reticle holder 24 to the projection optical unit 37 is a fixed space. These two spaces are combined together if the sheet glass 39 is omitted. It means that the shape of the space is variable with the scan motion, and additionally, the relative relationship between it and the nozzles for supplying the purge gas is also variable. This easily results in disturbance of the gas in the space. As compared with it, through the provision of the sheet glass 39, these spaces are isolated from each other. The space at the opening of the reticle holder 24 moves as a whole, without a variation in shape of the space. Disturbance is therefore small. As regards the space along the light path from the bottom face of the reticle holder 24 to the projection optical unit 37, since it is isolated from the space at the opening of the moving reticle holder 24 and thus it is maintained fixed, disturbance is small. As a result, the concentration distribution of impurities which absorb fluorine gas laser light becomes more stable, and a variation in exposure amount with respect to space and time is more stabilized. Additionally, since the space at the beginning of the reticle holder 24 can retain high gas-tightness, the concentration of impurities which absorb fluorine gas laser light can be suppressed more. As a result, the transmission factor is improved. Also, the impurity concentration distribution becomes more stable, and a variation in exposure amount with respect to space and time is more stabilized.

Now, the structure and function of the nozzles 44 and 45, blowing from the base table 35 toward the projection optical unit 37, will be explained. Regardless of whether the sheet glass 39 is provided or not provided, the clearance s3 between the projection optical unit 37 and the reticle running surface 32 (base table) may be sealed by supplying a purge gas thereto from an exclusive nozzle 45, or alternatively, it may be sealed by connecting them by use of a leaf spring, an elastic or resilient member, or any other element. This is effective to improve the gas tightness. However, for smaller transmission of vibration or deformation, the base table 35 and the projection optical unit 37 may not be connected to each other, to leave a clearance s3. Preferably, a small clearance portion may be defined with a circumferential structure of a desired shape, and a purge gas may be supplied by the nozzle 45 through that clearance portion, to accomplish the sealing. This clearance portion s3 may be defined at the side face of the projection optical unit, or it may be provided on the top face of the projection optical unit as shown in FIG. 9. The nozzle may be provided on the base table, while being directed to the clearance portion s3 or to the projection optical unit 37. As regards the nozzle 45, a plurality of nozzles may be provided along the entire circumference, with small intervals, so as to purge the whole circumference of the small clearance portion s3. Alternatively, a ring-like nozzle being split into plural segments, may be used. Further, one or more circumferential nozzles may be added. The small clearance portion s3 may be defined by opposed surfaces. Alternatively, it may be defined by a labyrinth seal comprising a combination of grooved shapes. On that occasion, the nozzle 45 may be omitted, although use of it may be better.

The structure described above concerns the sealing between the base table 35 and the projection optical unit 37. However, a similar structure may be used for any other portion which should be sealed and purged while suppressing transmission of vibration or deformation. For example, this is applicable to an example in which, in the first embodiment described hereinbefore, the partition wall 52 is provided by an ordinary rigid member, not a bellows, and in which a small clearance is left at the whole circumference, between the partition wall 52 and the projection optical unit 50, without connecting them.

Now, in FIG. 9, advantageous effects of the air blown by the nozzle 45 from the base table 35 toward the projection optical unit 37, will be described. The clearance s3 between the projection optical unit 37 and the reticle running surface 32 (base table) may be left open, without being connected to each other. This is because of the following reason. The nozzle 43 of the reticle holder 24, the plural nozzles 27 provided at the reticle running surface 32, or the nozzle 44 which is disposed toward the space along the light path from the base table or the bottom face of the reticle holder 24 to the projection optical unit 37, produces a purge gas by which a positive pressure is defined in the space along the light path from the bottom face of the reticle holder 24 to the projection optical unit 37. By this positive pressure, any gas from the outside can be blocked. However, because of the opening, a large quantity of gas has to be supplied. Also, the positive pressure becomes higher. When the nozzle 45 is used to purge the clearance s3, the amount of gases from the nozzles 42, 43 and 44 can be made smaller and, therefore, the positive pressure can be made lower. Since the positive pressure can be lowered, unwanted deformation of the reticle 25, the projection lens 37 and the sheet glass 39 can be prevented. Also, because high gas tightness can be retained, the concentration of impurities which absorb fluorine gas laser light can be suppressed more, and the transmission factor can be improved. Further, the impurity concentration distribution becomes more stable, and a variation in exposure amount with respect to space and time can be stabilized more. Simultaneously, transmission of vibration and deformation can be prevented.

Embodiment 10

In the eighth and ninth embodiments, a pressure sensor 34 is provided inside the reticle holder 24 or, alternatively, at an opening 28 of the reticle stage base table 35. Further, there is a purge gas supplying mechanism 36 having a control system for controlling the pressure of the purge gas. On the basis of the pressure as measured by the pressure sensor, the pressure control of the purge gas is performed so that it is controlled constant regardless of the atmospheric pressure.

Advantageous effects peculiar to this embodiment are as follows. The inside of a barrel of the projection optical unit 37 is purged by an inactive gas to remove impurities therein, and a substantially gas-tightly closed system is defined. Therefore, it does not promptly follow a change in outside atmospheric pressure, such that a differential pressure is generated between the barrel inside and the outside. This raises a problem that an optical element at the top of the projection optical unit 37 is deformed due to the differential pressure, and it causes variation in the optical performance in accordance with the pressure change. In this embodiment, however, the purge gas pressure in the space above the projection optical unit 37 is controlled to be constant so that no differential pressure is generated. As a result, a change in optical performance due to a pressure change can be suppressed.

When the reticle holder 24 is provided with a sheet glass 39, the purge gas pressure inside the reticle holder 24 and the purge gas pressure at the opening 28 of the reticle stage base table may be controlled to be constant. This prevents creation of a differential pressure. Therefore, the sheet glass 39 is not deformed, and a change in optical performance can be avoided. Further, since the purge gas pressures above and below the reticle 25 are constant, and no differential pressure is produced, deformation of the reticle 25 does not occur.

In cases when flexure of the reticle 25 due to the weight of itself or the flatness thereof raises a problem as defocus or distortion, the purge gas pressure at the space of the reticle holder 24 as defined by the reticle 25 and the sheet glass 39 may be controlled to be constant, to a known optimum pressure. This provides the ability to cause a certain amount of deformation of the reticle 25 or the sheet glass 39, to thereby reduce the defocus or distortion. The optimum pressure may be determined as follows. That is, a desired reticle 25 is used, and exposures are made while changing the purge gas pressure. Then, defocus or distortion is inspected, and a purge gas pressure with which the defocus or distortion is smallest may be taken as an optimum purge gas pressure. Alternatively, it may be determined on the basis of simulation.

Embodiment 11

Figure 10:
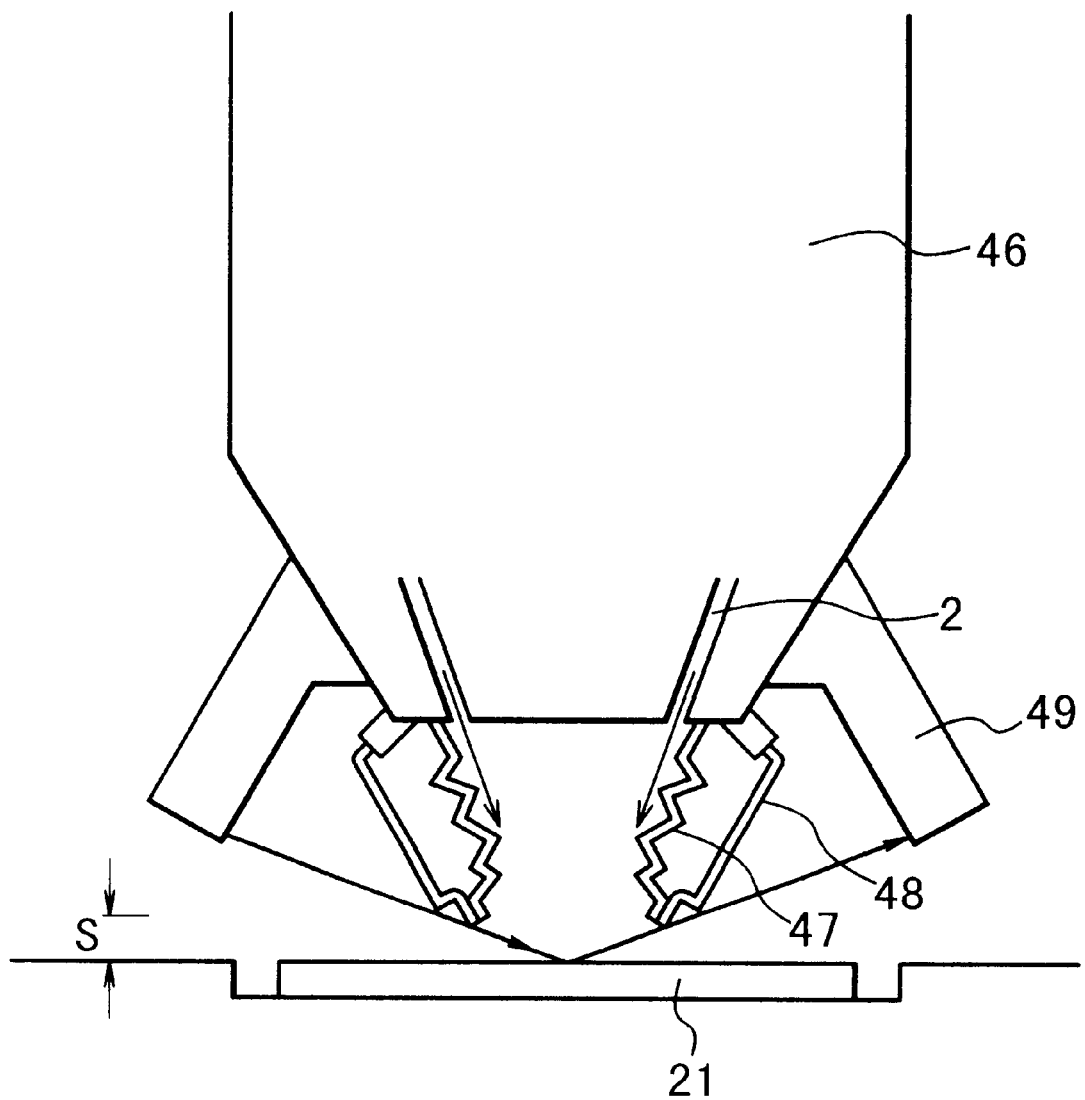
FIG. 10 is a schematic view of a structure about a reticle and a wafer, in a projection exposure apparatus according to a further embodiment of the present invention.

FIG. 10 shows an embodiment in which the cover has an extendible/contractible structure, and in which a cover driving unit for extending or contracting the extendible/contractible structure of the cover is provided at a reticle side lower end of an illumination optical unit or at the wafer side lower end of a projection optical unit inside an exposure apparatus.

In FIG. 10, there is a cover 47 of an extendible/contractible structure disposed at the lower end of an illumination optical unit or a projection optical unit 46, facing to a reticle or a wafer 21. This cover can be actuated by a cover driving unit 48. Inside this cover 47, inactive gases are discharged by nozzles 2. Further, mounted at the reticle side lower end of the illumination optical unit and/or at the wafer side lower end of the projection optical unit inside the exposure apparatus is a measuring device 49 for measuring the distance between it and the reticle or the wafer. It emits and receives measurement light, and the result obtained by the measurement is applied to the cover driving unit 48, whereby the extending or retracting motion of the cover 47 is controlled.

Embodiment 12

In the foregoing embodiments, purging gases comprising an inactive gas such as nitrogen, helium or argon are blown by associated nozzles. In this embodiment, a mechanism for mixing oxygen ($O_2$) or ozone ($O_3$) into an inactive gas is added. During a normal exposure operation, oxygen or ozone is not mixed and only an inactive gas is supplied. During a stand-by period in which the exposure apparatus is not operated, or during the normal exposure operation at designated intervals, or alternatively when a reticle is loaded on a reticle stage, a very small amount of oxygen and/or ozone is mixed into the inactive gas to perform the purging. Then, without loading a wafer, a dummy exposure operation is carried out in a certain time period or until a predetermined image plane illuminance is accomplished. Thereafter, the mixing of oxygen and/or ozone is stopped, and only an inactive gas is blown to perform the purging. After this, the normal exposure operation is carried out.

Advantageous effects peculiar to the procedure described above will be explained. When exposure light having a wavelength in the deep ultraviolet region, particularly, short-wavelength exposure light of an ArF excimer laser or $F_2$ excimer laser, is used, the exposure light functions to decompose impurities such as organic molecules, in the air. Decomposed matters are deposited on optical elements, and a carbon film or a film containing carbon (i.e., organic compound) is deposited on the surface of the optical elements. This causes a gradual decrease of the transmission factor of the optical element, to cause a decrease of the image plane illuminance and then a decrease of the throughput. In the preceding embodiments, a space close to a reticle or a wafer 21 is purged by using an inactive gas to reduce the impurity concentration as much as possible. However, there is a possibility that a very small amount of impurities remains there. Further, there may be cases where, during or before an exposure operation, degassing occurs from a resist applied to a wafer or an adhesive agent layer between a resist and a wafer, and impurities are present adjacent to a sheet glass 22 at the bottom end of the projection optical unit 10. Moreover, there may be cases wherein a reticle having a small amount of impurities attached thereto is loaded, and some of them are vaporized. Alternatively, there may be cases wherein degassing occurs from an adhesive agent layer between the reticle and a pellicle frame thereof, or from an adhesive agent layer between the pellicle frame and a pellicle supported thereby. If this occurs, impurities may be present adjacent to an exposure surface of the reticle, adjacent to the sheet glass 22 at the bottom end of the illumination optical unit 1, adjacent to the sheet glass 39 of the reticle holder 24, or adjacent to the surface of an optical element at the top end of the projection optical unit 37. In these cases, organic compounds produced by decomposition, caused by the exposure, are deposited on these optical elements, and the transmission factor of them decreases gradually. However, if such an optical element is irradiated with exposure light, while a small amount of ozone is mixed into an inactive gas and the purging is made by the use of this, the deposited organic compound is oxidized and decomposed due to what is called an ozone washing effect. Also, deposition of a decomposed product itself can be prevented. Alternatively, when a small amount of oxygen is mixed into an inactive gas and the purging is done by use of this, and when such an optical element is irradiated with exposure light, since oxygen is transformed into ozone by a photochemical reaction, an ozone washing effect similar to a case where ozone is mixed is obtainable. Therefore, by performing this periodically, as described above, a decrease of image plane illuminance can be prevented, and a high throughput can be retained.

Embodiment of Semiconductor Manufacturing System

Next, an embodiment of a manufacturing system for manufacturing semiconductor devices such as semiconductor chips (e.g., IC or LSI), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service such as software supply, can be made by use of a computer network outside the manufacturing factory.

Figure 11:
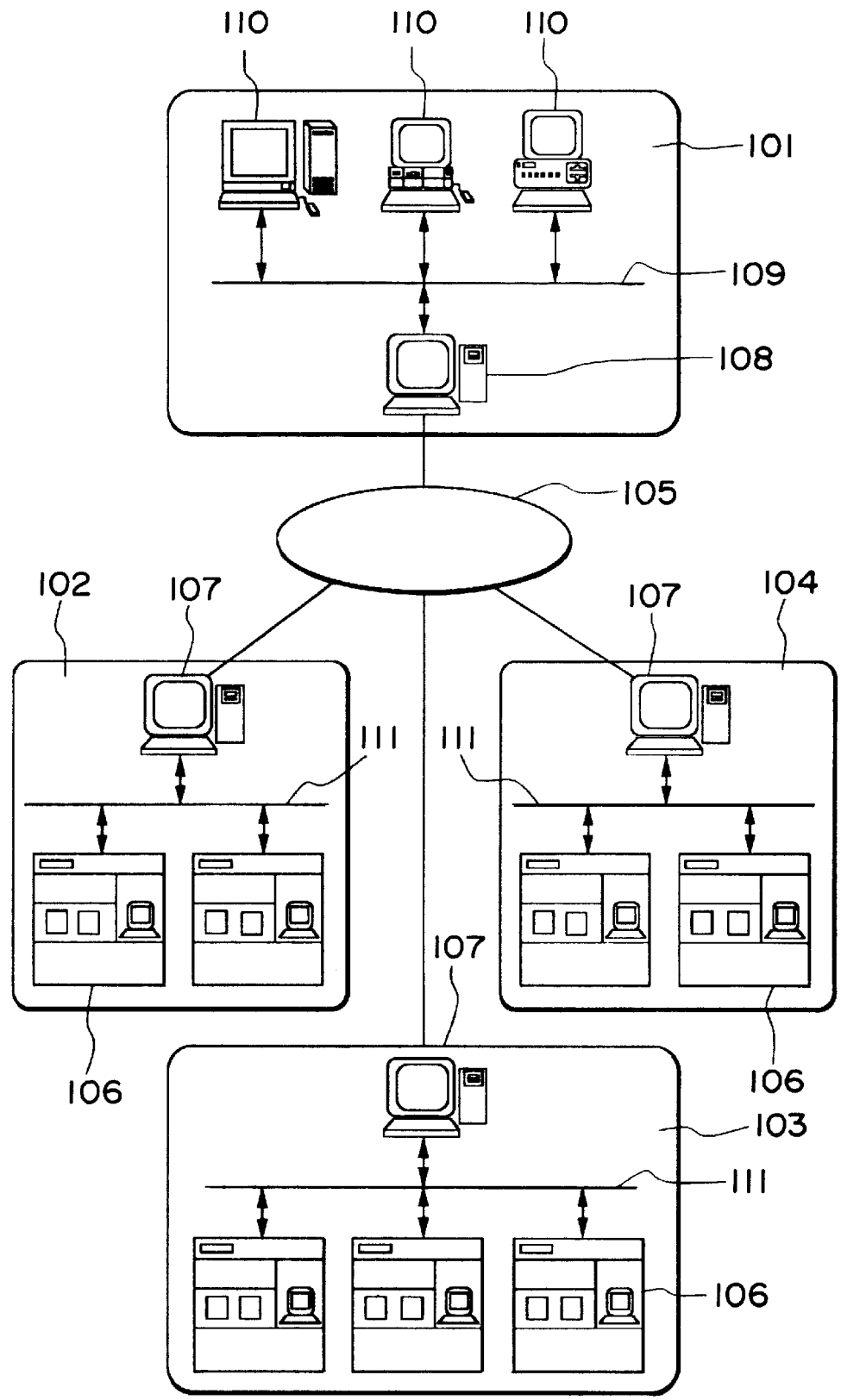
FIG. 11 is a schematic view of a semiconductor device manufacturing system, as viewed in a certain aspect thereof.

FIG. 11 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (various lithographic apparatuses such as an exposure apparatus, a resist coating apparatus, an etching apparatus, for example, as well as a heat treatment apparatus, a film forming apparatus, and a flattening apparatus) and post-process machines (an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to an internet 105 which is an outside network of the office, and a security function for restricting the access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each of the factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105 which is an outside network of the factory. With this structure, the host control system 108 of the vendor 101 can be accessed from the LAN 111 in each factory, through the internet 105. Further, due to the security function of the host control system 108, only admitted users can gain access thereto. More specifically, through the internet 105, status information representing the state of operation of the production machines 106 (for example, the state of the machine in which any disorder has occurred) may be transmitted as a notice from the factory to the vendor. Additionally, any response information which is responsive to the notice (that is, for example, information on how the disorder should be treated or software data concerning the treatment) as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet. In place of using the internet, an exclusive line network (e.g., ISDN) controlled with a strictest security that an access of a third party is not allowed, may be used. Further, the host control system is not limited to the system as provided by the vendor. A database may be structured by the user and it may be set in an outside network, such that it can be accessed from plural user factories.

Figure 12:
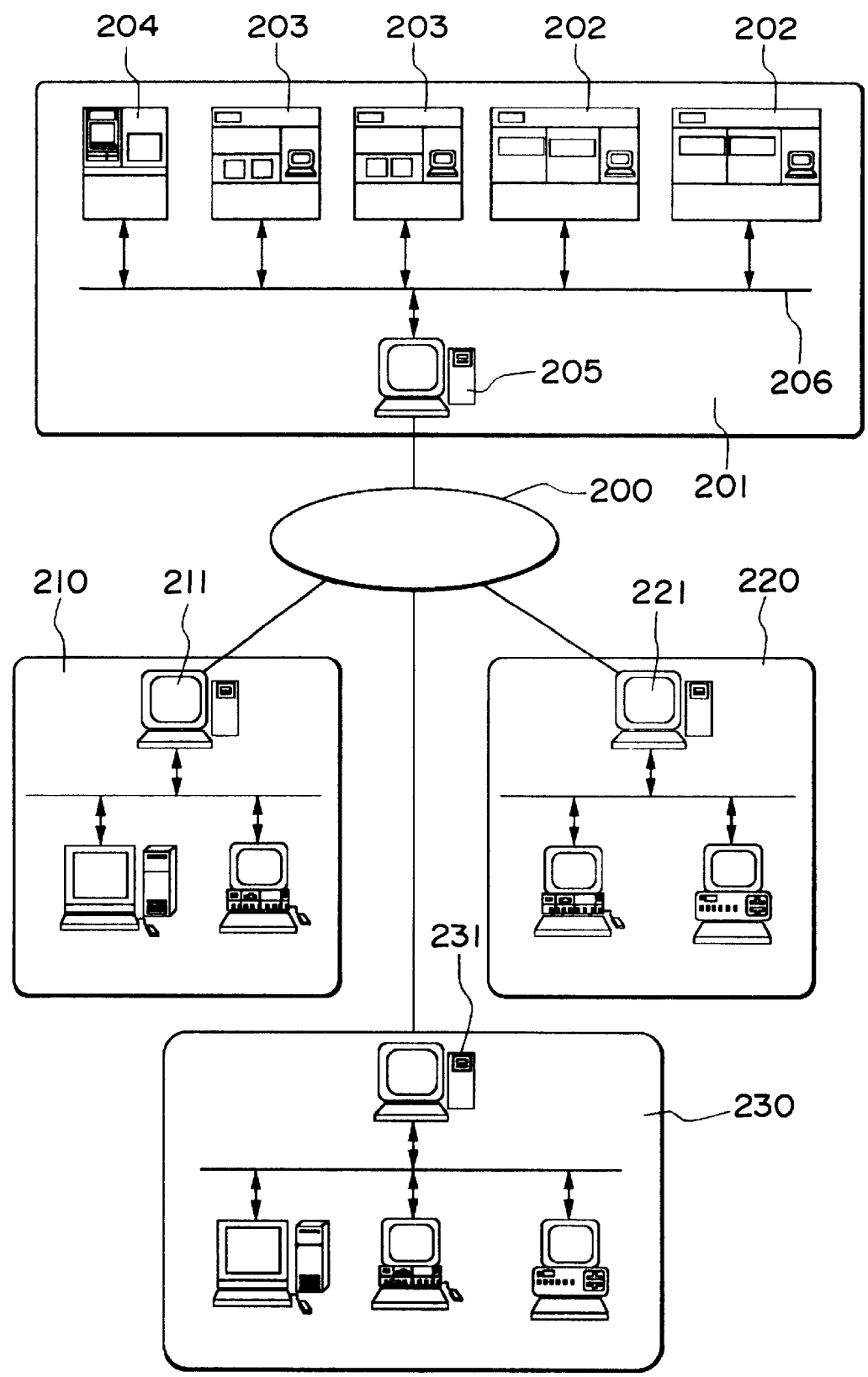
FIG. 12 is a schematic view of a semiconductor device manufacturing system, as viewed in another aspect thereof.

FIG. 12 is a schematic view of a general structure of the production system according to this embodiment, in another aspect thereof different from that of FIG. 11. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 201, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 25.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or wide-use web browser, and a user screen interface such as shown in FIG. 13, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each item, or he/she can get a latest version software to be used for the production machine, from the software library a provided by the vendor. Alternatively, the operator can get an operation guide (help information) prepared for factory operators.

Next, a semiconductor device manufacturing process which uses the production system described above, will be explained.

Figure 14:
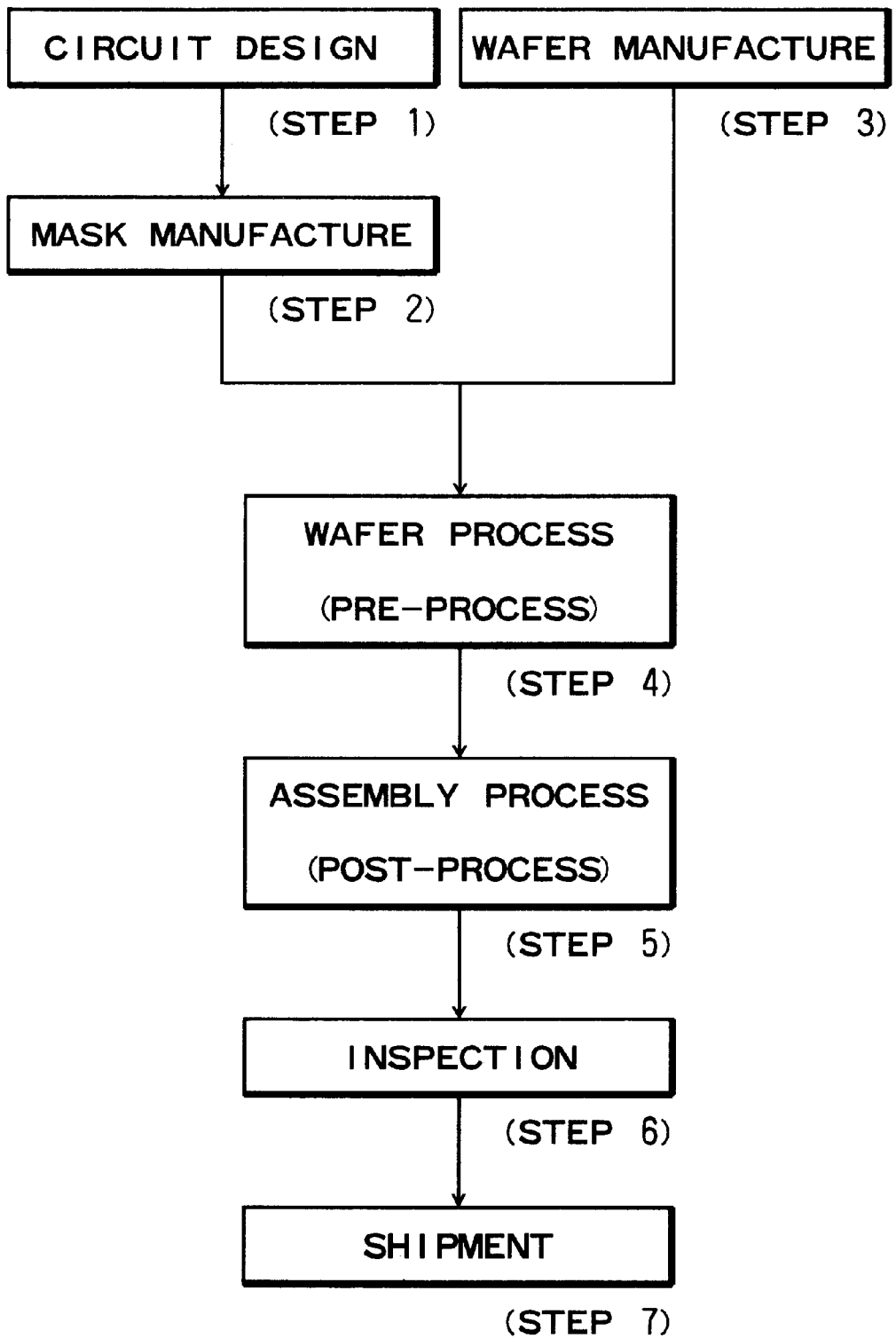
FIG. 14 is a flow chart of device manufacturing processes.

FIG. 14 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 15:
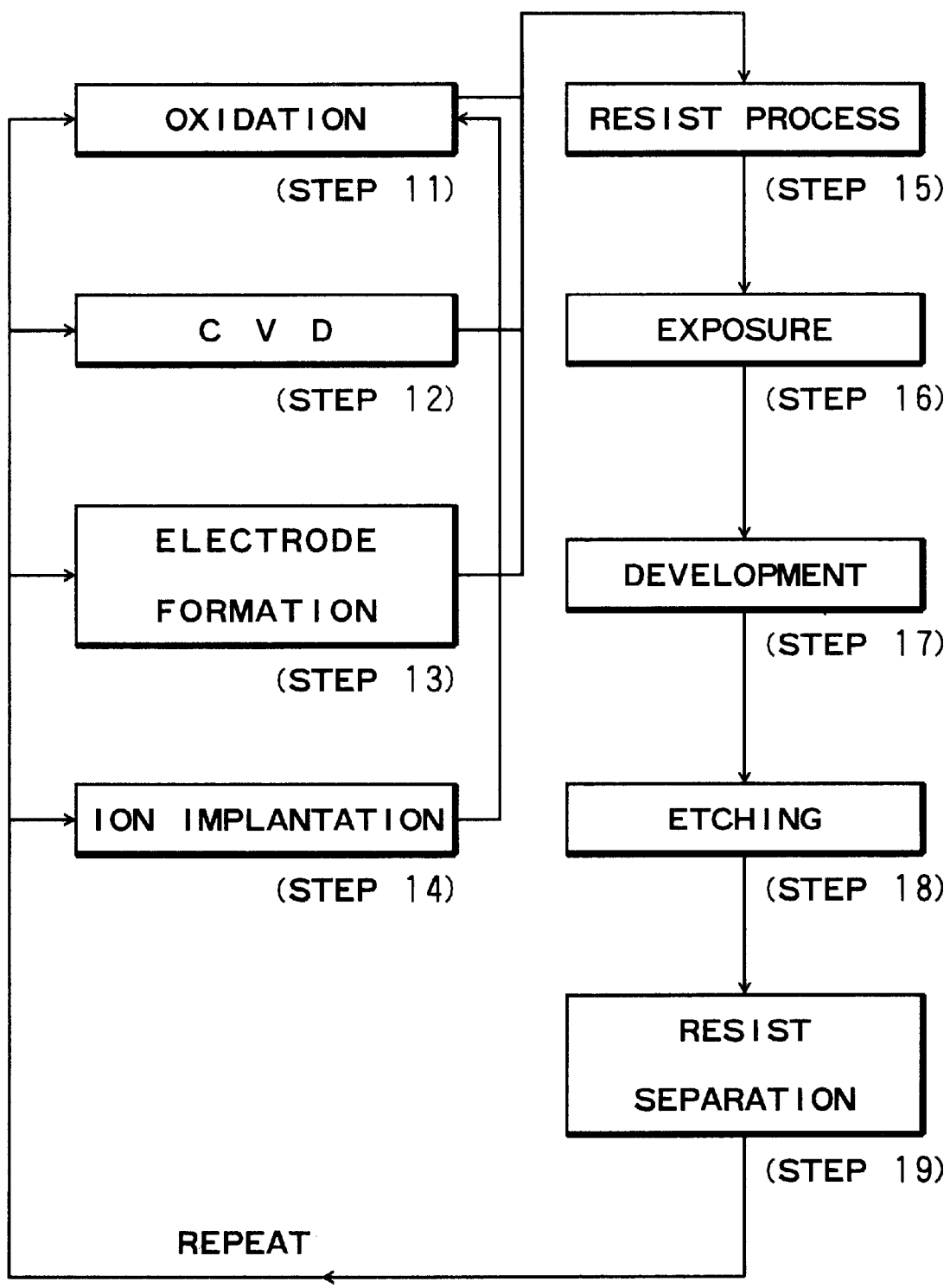
FIG. 15 is a flow chart for explaining details of a wafer process in the procedure shown in FIG. 14.

FIG. 15 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In accordance with the present invention, as described hereinbefore, in an exposure apparatus using ultraviolet light, more particularly, an ArF excimer laser or $F_2$ excimer laser, oxygen and water concentration in a particular portion close to a reticle or a wafer can be purged effectively. This assures a sufficient transmission factor to the ArF excimer laser light or $F_2$ excimer laser light as well as the stability of ultraviolet light. As a result, high precision projection exposure is enabled, and projection of a very fine circuit pattern can be done satisfactorily.

While the invention has been described with reference to the structures disclosed herein, it is not confined to the details set forth and this application is intended to cover such modifications or changes as may come within the purposes of the improvements or the scope of the following claims.

What is claimed is:

1. A scan type exposure apparatus for transferring an image of a pattern formed on a mask onto a substrate by synchronously scanning the mask and the substrate in a scanning direction, said apparatus comprising:

a movable stage for holding a substrate thereon;

an optical system through which an exposure light path extends;

a cover member for encircling the exposure light path, from an end of said optical system toward said stage; and a gas supplying port for discharging an inactive gas into said cover member, wherein the gas is supplied in a direction substantially parallel to or perpendicular to the scanning direction.

2. An apparatus according to claim 1, wherein the substrate is a reticle, and wherein said optical system is an illumination optical system.

3. An apparatus according to claim 1, wherein the substrate is a wafer, and wherein said optical system is a projection optical system.

4. An apparatus according to claim 1, wherein said gas supplying port comprises at least one nozzle.

5. An apparatus according to claim 1, wherein said cover member has a gas collecting port formed inside said cover member, for collecting a gas inside said cover member, and wherein the inactive gas flows from said gas supplying port to said gas collecting port.

6. An apparatus according to claim 1, wherein said cover member is made extendible and contractible.

7. An apparatus according to claim 6, wherein said cover member comprises a bellows.

8. An apparatus according to claim 7, wherein said bellows is made of a fluorine resin material.

9. An apparatus according to claim 6, further comprising actuating means for causing extension and contraction of said cover member.

10. An apparatus according to claim 9, further comprising measuring means for measuring a height of the substrate, wherein said actuating means is controlled on the basis of the measurement by said measuring means.

11. An apparatus according to claim 1, further comprising a top plate mounted on said movable stage while being held coplanar with the substrate.

12. An apparatus according to claim 1, wherein a portion of said cover member is defined by a gas curtain formed by an inactive gas discharged from a nozzle.

13. An apparatus according to claim 1, further comprising a nozzle for producing a gas curtain with use of an inactive gas, separately from said cover member.

14. An apparatus according to claim 1, further comprising a pressure gauge for measuring a pressure inside said cover member, and a gas supplying mechanism for controlling a pressure of an inactive gas inside said cover member, wherein said gas supplying mechanism is controlled on the basis of an output of said pressure gauge.

15. An apparatus according to claim 1, wherein exposure light used for exposure of the substrate is ultraviolet light.

16. An apparatus according to claim 15, wherein the ultraviolet light is laser light.

17. An apparatus according to claim 16, wherein the laser light is light of one of a fluorine excimer laser and an ArF excimer laser.

18. An apparatus according to claim 1, wherein the inactive gas contains one of nitrogen, helium and argon.

19. An apparatus according to claim 1, further comprising a mechanism for mixing oxygen or ozone into the inactive gas.

20. A scanning exposure apparatus, comprising:
a reticle stage being movable on a base table;
a reticle holder mounted on said reticle stage, for holding a reticle thereon; and
a gas supplying port for discharging an inactive gas into a space defined by the reticle and said reticle holder, wherein said gas supplying port is provided on at least one of said base table and said reticle holder, and the gas is supplied in a direction substantially parallel to or perpendicular to a scanning direction.

21. An apparatus according to claim 20, further comprising a pressure gauge for measuring a pressure of the space, and a gas supplying mechanism for controlling a pressure of an inactive gas inside the space, wherein said gas supplying mechanism is controlled on the basis of an output of said pressure gauge.

22. An apparatus according to claim 20, wherein exposure light used in said exposure apparatus for exposure of a substrate is ultraviolet light.

23. An apparatus according to claim 22, wherein the ultraviolet light is a laser light.

24. An apparatus according to claim 23, wherein the laser light is light of one of a fluorine excimer laser and an ArF excimer laser.

25. An apparatus according to claim 20, wherein the inactive gas contains one of nitrogen, helium and argon.

26. An apparatus according to claim 20, further comprising a mechanism for mixing oxygen or ozone into the inactive gas.

27. An exposure apparatus, comprising:
a reticle stage being movable;
a reticle holder mounted on said reticle stage, for holding a reticle thereon;
a sheet glass provided on said reticle stage; and
a gas supplying port for discharging an inactive gas into a space defined by the reticle and said sheet glass.

28. An apparatus according to claim 27, wherein a bottom face of said reticle stage and a bottom face of said sheet glass are made coplanar with each other.

29. An apparatus according to claim 27, further comprising a pressure gauge for measuring a pressure of the space, and a gas supplying mechanism for controlling a pressure of an inactive gas inside the space, wherein said gas supplying mechanism is controlled on the basis of an output of said pressure gauge.

30. An apparatus according to claim 27, wherein exposure light used in said exposure apparatus for exposure of a substrate is ultraviolet light.

31. An apparatus according to claim 30, wherein the ultraviolet light is laser light.

32. An apparatus according to claim 31, wherein the laser light is light of one of a fluorine excimer laser and an ArF excimer laser.

33. An apparatus according to claim 27, wherein the inactive gas contains one of nitrogen, helium and argon.

34. An apparatus according to claim 27, further comprising a mechanism for mixing oxygen or ozone into the inactive gas.

35. A device manufacturing method, comprising the steps of:
coating a wafer with a photosensitive material;
exposing the wafer by use of an exposure apparatus as recited in claim 1; and
developing the exposed wafer.

36. A device manufacturing method, comprising the steps of:
coating a wafer with a photosensitive material;
exposing the wafer by use of an exposure apparatus as recited in claim 20; and
developing the exposed wafer.

37. A device manufacturing method, comprising the steps of:
coating a wafer with a photosensitive material;
exposing the wafer by use of an exposure apparatus as recited in claim 27; and
developing the exposed wafer.

38. An exposure apparatus comprising:
movable stage for holding a substrate thereon;
an optical system through which an exposure light path extends;

a cover member for encircling the exposure light path, from an end of said optical system toward said stage, wherein said cover member is made extendible and contractible; and a gas supplying port for discharging an inactive gas into said cover member.

39. An apparatus according to claim 38, wherein said cover member comprises a bellows.

40. An apparatus according to claim 39, wherein said bellows is made of a fluorine resin material.

41. An apparatus according to claim 38, further comprising actuating means for causing extension and contraction of said cover member.

42. An apparatus according to claim 41, further comprising measuring means for measuring a height of the substrate, wherein said actuating means is controlled on the basis of the measurement by said measuring means.

43. A scanning exposure apparatus, comprising:

a reticle stage being movable on a base table;

a reticle holder mounted on said reticle stage, for holding a reticle thereon; and a gas supplying port for discharging an inactive gas into a space defined by the reticle and said reticle holder, wherein the gas is supplied in a direction substantially parallel to or perpendicular to a scanning direction.

44. An apparatus according to claim 43, further comprising a pressure gauge for measuring a pressure of the space, and a gas supplying mechanism for controlling a pressure of an inactive gas inside the space, wherein said gas supplying mechanism is controlled on the basis of an output of said pressure gauge.

45. An apparatus according to claim 43, wherein exposure light used in said exposure apparatus for exposure of a substrate is ultraviolet light.

46. An apparatus according to claim 45, wherein the ultraviolet light is a laser light.

47. An apparatus according to claim 46, wherein the laser light is light of one of a fluorine excimer laser and an ArF excimer laser.

48. An apparatus according to claim 43, wherein the inactive gas contains one of nitrogen, helium and argon.

49. An apparatus according to claim 43, further comprising a mechanism for mixing oxygen or ozone into the inactive gas.

* * * * *